(12) United States Patent
Liu

(10) Patent No.: US 9,502,479 B2
(45) Date of Patent: Nov. 22, 2016

(54) TRANSPARENT DISPLAY DEVICE AND MANUFACTURING METHOD THEREOF

(71) Applicant: BOE TECHNOLOGY GROUP CO., LTD., Beijing (CN)

(72) Inventor: Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 14 days.

(21) Appl. No.: 14/436,570

(22) PCT Filed: Aug. 21, 2014

(86) PCT No.: PCT/CN2014/084934
§ 371 (c)(1),
(2) Date: Apr. 17, 2015

(87) PCT Pub. No.: WO2015/158089
PCT Pub. Date: Oct. 22, 2015

(65) Prior Publication Data
US 2016/0181330 A1    Jun. 23, 2016

(30) Foreign Application Priority Data
Apr. 16, 2014 (CN) .......................... 2014 1 0153794

(51) Int. Cl.
| H01L 29/08 | (2006.01) |
| H01L 35/24 | (2006.01) |
| H01L 51/00 | (2006.01) |
| H01L 27/32 | (2006.01) |

(52) U.S. Cl.
CPC ......... *H01L 27/3227* (2013.01); *H01L 27/326* (2013.01); *H01L 27/3262* (2013.01); *H01L 27/3269* (2013.01); *H01L 27/3272* (2013.01); *H01L 27/3276* (2013.01)

(58) Field of Classification Search
USPC .................. 257/40; 349/113, 114; 438/82, 99
See application file for complete search history.

(56) References Cited

U.S. PATENT DOCUMENTS

| 2003/0081158 A1* | 5/2003 | Li ....................... G02F 1/13306 349/113 |
| 2007/0102035 A1 | 5/2007 | Yang |

(Continued)

FOREIGN PATENT DOCUMENTS

| CN | 101813849 A | 8/2010 |
| CN | 103105706 A | 5/2013 |

(Continued)

OTHER PUBLICATIONS

International Search Report of the International Searching Authority for PCT/CN2014/084934 mailed on Feb. 4, 2015 in Chinese.

(Continued)

*Primary Examiner* — Errol Fernandes
(74) *Attorney, Agent, or Firm* — Collard & Roe, P.C.

(57) ABSTRACT

Embodiments of the present invention relate to a transparent display device and a manufacturing method thereof. A display region of the transparent display device includes light a transmission area (12) and a light shield area (11). At least one silicon solar cell is disposed in a partial area of the light transmission area (12). The silicon solar cell is configured to absorb optical energy in the direction perpendicular to the light transmission direction of the light transmission area (12) and convert the optical energy into electric energy.

20 Claims, 2 Drawing Sheets

(56) References Cited

U.S. PATENT DOCUMENTS

| | | |
|---|---|---|
| 2009/0219273 A1 | 9/2009 | Nathan et al. |
| 2011/0109853 A1* | 5/2011 | Ge .................. G02F 1/1343 |
| | | 349/114 |
| 2011/0163661 A1* | 7/2011 | Lee .................. H01L 27/3227 |
| | | 313/504 |
| 2012/0326131 A1 | 12/2012 | Han |

FOREIGN PATENT DOCUMENTS

| | | |
|---|---|---|
| CN | 103137024 A | 6/2013 |
| CN | 103529581 A | 1/2014 |
| CN | 103681774 A | 3/2014 |
| CN | 103700691 A | 4/2014 |
| CN | 103985734 A | 8/2014 |
| CN | 203774331 U | 8/2014 |

OTHER PUBLICATIONS

Written Opinion of the International Searching Authority for PCT/CN2014/084934 mailed on Feb. 4, 2015 in Chinese and the English translation.

Second Chinese Office Action in Chinese Application No. 201410153794.5, mailed Sep. 5, 2016 with English ranslation.

* cited by examiner

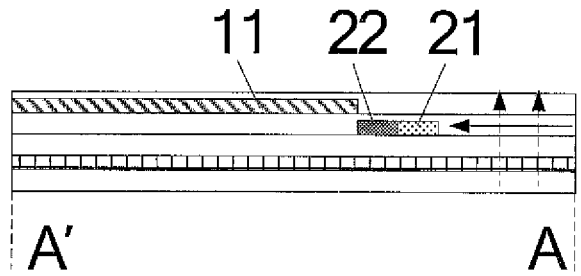

FIG. 3

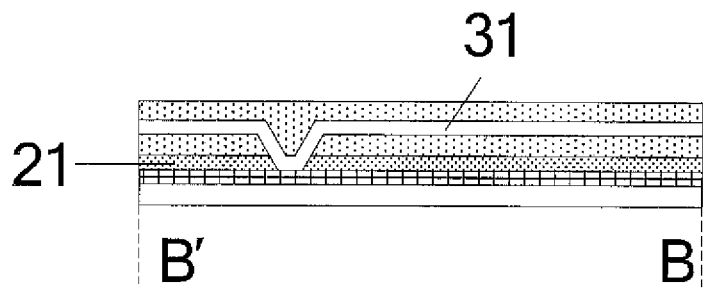

FIG. 4

| Forming a semiconductor layer on the base substrate, in which the semiconductor layer includes a portion corresponding to a P-type semiconductor and a Portion corresponding to an N-type semiconductor | S101 |

| Performing ion doping on the portion corresponding to the P-type semiconductor and the portion corresponding to the N-type semiconductor of the semiconductor layer respectively to form the P-type semiconductor and the N-type semiconductor | S102 |

FIG. 5

TRANSPARENT DISPLAY DEVICE AND MANUFACTURING METHOD THEREOF

CROSS REFERENCE TO RELATED APPLICATIONS

This application is the National Stage of PCT/CN2014/084934 filed on Aug. 21, 2014, which claims priority under 35 U.S.C. §119 of Chinese Application No. 201410153794.5 filed on Apr. 16, 2014, the disclosure of which is incorporated by reference.

TECHNICAL FIELD

Embodiments of the present invention relate to a transparent display device and a manufacturing method thereof.

BACKGROUND

With the advance of display technology, new display technology is constantly proposed and implemented. Transparent display product is such a new display product. Transparent display has a wide application range, can integrate multi-touch, smart display and other technologies, is taken as a public information display terminal and applied in various fields such as show windows, refrigerator door penetration, front windshields of automobiles and vending machines, and has the synergistic effects of display, interaction, advertising, etc. The transparent display products attract more and more attention in the application field of special display due to the unique use scene and the capability of achieving intelligent scene change.

The display principle of the transparent display technology of organic light-emitting diode (OLED) display devices is illustrated in FIG. 1. The display panel comprises a plurality of display units 100. Each display unit includes three sub-pixels 10 (gate lines 31 and data lines 32 intersect each other to form a plurality of sub-pixels 10) with three primary colors, namely red (R), green (G) and blue (B). Each sub-pixel 10 includes a light-emitting area 11 and a light transmission area 12. The light-emitting area 11 achieves display via the light emission of an OLED. The light transmission area 12 is not provided with any pixel structure and is mainly used for light transmission. Moreover, along with the enhanced brightness of the light-emitting area 11, more light will be transmitted from the light transmission area 12. Thus, the transmittance of pixels can be improved, and hence the transparent display effect can be achieved.

SUMMARY

Embodiments of the present invention provide a transparent display device and a manufacturing method thereof, in which a silicon solar cell is disposed in light transmission areas of the display device to absorb optical energy in the direction perpendicular to the light transmission direction of the light transmission area and convert the optical energy into electric energy.

The embodiment of the present invention provides a transparent display device, which comprises a display region. The display region includes a light transmission area and a light shield area, in which at least one silicon solar cell is disposed in partial area of the light transmission area; and the silicon solar cell is configured to absorb optical energy in a direction perpendicular to the light transmission direction of the light transmission area and convert the optical energy into electric energy.

In one example, the silicon solar cell includes a P-type semiconductor and an N-type semiconductor which are arranged in the same layer.

In one example, an intrinsic layer is disposed between the P-type semiconductor and the N-type semiconductor.

In one example, both the P-type semiconductor and the N-type semiconductor are heavily doped.

In one example, the display device further comprises a gate line and a data line; and the P-type semiconductor or the N-type semiconductor of the silicon solar cell makes direct contact with the gate line and/or the data line to form electrical connection to provide an electrical signal for the gate line and/or the data line.

In one example, the display region includes a plurality of sub-pixels; each sub-pixel includes the light transmission area and the light shield area; and the silicon solar cell is provided in the light transmission area of at least one sub-pixel.

In one example, the light transmission area of each sub-pixel is provided with one silicon solar cell.

In one example, the display device is an organic light-emitting diode (OLED) display device; and each sub-pixel includes a light-emitting area and the light transmission area.

In one example, the silicon solar cell is disposed in partial area on a side of the light transmission area close to the light-emitting area.

The embodiment of the present invention further provides a method for manufacturing a transparent display device. A display region of the transparent display device includes a light transmission area and a light shield area. The method comprises: directly forming silicon a solar cell on a base substrate corresponding to partial area of the light transmission area, in which the silicon solar cell is configured to absorb optical energy in the direction perpendicular to the light transmission direction of the light transmission area and convert the optical energy into electric energy.

In one example, in the process of directly forming the silicon solar cells on the base substrate corresponding to the partial areas of the light transmission areas, a semiconductor layer is formed on the base substrate, in which the semiconductor layer includes a portion corresponding to a P-type semiconductor and a portion corresponding to an N-type semiconductor; and the portion corresponding to the P-type semiconductor and the portion corresponding to the N-type semiconductor of the semiconductor layer are subjected to ion doping respectively to form the P-type semiconductor and the N-type semiconductor.

In one example, in the process of respectively performing ion doping on the portions corresponding to the P-type semiconductors and the portions corresponding to the N-type semiconductors of the semiconductor layer, the portion of the semiconductor layer corresponding to the P-type semiconductor is subjected to ion doping via a first mask to form the P-type semiconductor; and the portion of the semiconductor layer corresponding to the N-type semiconductor is subjected to ion doping via a second mask to form the N-type semiconductor.

In one example, the semiconductor layer further includes: an active semiconductor.

In one example, the method further comprises: forming a gate metal layer and a source/drain metal layer on the base substrate, in which the gate metal layer includes a gate line, and the source/drain metal layer includes a data line; and allowing the gate line and/or the data line to make direct contact with the P-type semiconductor or the N-type semiconductor of the silicon solar cell to form electrical connection.

BRIEF DESCRIPTION OF THE DRAWINGS

More detailed description will be given below to the embodiments of the present invention with reference to the accompanying drawings to provide a more clear understanding of the present invention, in which:

FIG. 3 is an A-A' sectional view of the display device as illustrated in FIG. 2;

FIG. 4 is a B-B' sectional view of the display device as illustrated in FIG. 2; and FIG. 5 is a schematic diagram of a method for directly forming silicon solar cells on a base substrate, provided by the embodiment of the present invention.

DETAILED DESCRIPTION

Figure 1:
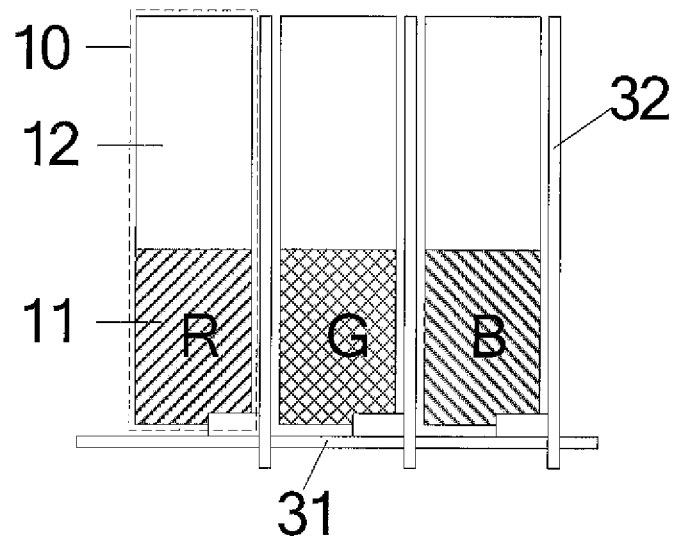
FIG. 1 is a schematic diagram of a transparent display device.

Clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise specified, the technical terms or scientific terms used herein have normal meanings understood by those skilled in the art. The words "first", "second" and the like used in the description and the claims of the patent application of the present invention do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "on", "beneath" and the like only indicate the relative position relationship which is correspondingly changed when the absolute position of a described object is changed.

The embodiment of the present invention provides a transparent display device. A display region of the transparent display device includes light transmission areas and light shield areas. At least one silicon solar cell is disposed in partial area of the light transmission area. The silicon solar cell is configured to absorb optical energy in the direction perpendicular to the light transmission direction of the light transmission area and convert the optical energy into electric energy.

The structures such as organic electroluminescent (EL) elements and drive circuits of an OLED display device are usually non-transparent. In the case of design, the non-transparent devices may be highly integrated into an "area", not provided with the non-transparent devices, in each pixel. Along with the increase of the gray-scale value of pixel display, more light will run through other transparent areas of pixels. Therefore, the transmittance of the pixels can be improved, and hence the transparent display effect can be achieved.

It should be noted that the display region of the transparent display device includes light transmission areas and light shield areas. The light shield areas are mainly used for illuminating the pixels. The light transmission areas are mainly used for light transmission, so that the display device can allow people to view objects and the like at the rear. The position relation between the light transmission areas and the light shield areas of the display region may be various. For instance, one pixel unit may include red, green and blue sub-pixels and a transparent light transmission area, or the light transmission areas and the light shield areas may also be arranged in the form of line interval. The position relation between the light transmission areas and the light shield areas of the display region is not specifically limited in the embodiment of the present invention and may be changed as required.

Figure 2:
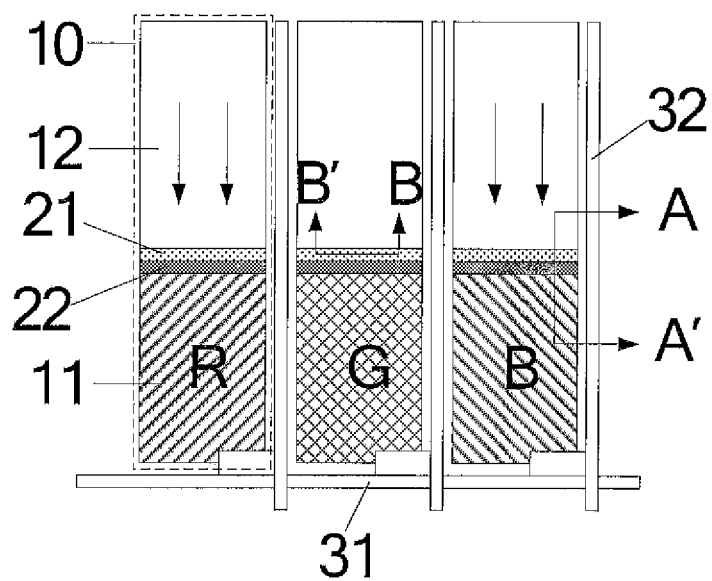
FIG. 2 is a schematic diagram of a transparent display device provided by the embodiment of the present invention.

At least one silicon solar cell is disposed in partial area of the light transmission area. The silicon solar cell absorbs optical energy in the direction perpendicular to the light transmission direction of the light transmission area. It should be noted that: as illustrated in FIGS. 2 and 3, the light transmission direction of a light transmission area 12 of a transparent display unit 100 generally refers to the direction perpendicular to a base substrate, namely the direction indicated by dashed arrows in FIG. 3. In the embodiment of the present invention, the silicon solar cell mainly absorbs optical energy in the direction perpendicular to the light transmission direction of the light transmission area 12, namely the optical energy in the direction indicated by the arrow as illustrated in FIGS. 2 and 3 (the direction parallel to a surface of the substrate), and converts the optical energy into electric energy. The electric energy may be applied in other electronic devices.

The embodiment of the present invention provides a transparent display device. At least one silicon solar cell is disposed in partial area of a light transmission area of the transparent display device. The silicon solar cell is configured to absorb optical energy in the direction perpendicular to the light transmission direction of the light transmission area and convert the optical energy into electric energy. The electric energy may be used for supplying power for display devices or other components or devices, so that the energy sources can be saved, and hence the effective utilization of light and electricity can be achieved.

Optionally, as illustrated in FIGS. 2 and 3, the silicon solar cell includes a P-type semiconductor 21 and an N-type semiconductor 22. Moreover, the P-type semiconductor 21 and the N-type semiconductor 22 are arranged in the same layer.

It should be noted that: the P-type semiconductor is obtained by doping trivalent elements in semiconductor materials such as silicon or germanium crystals; and the N-type semiconductor is obtained by doping pentavalent elements in semiconductor materials such as silicon or germanium crystals.

The principle of the silicon solar cell is that: upon the P-type semiconductor and the N-type semiconductor being combined with each other, a special film, namely a PN junction, will be formed in an interface region of the two semiconductors. The reason is that the P-type semiconductor has a large quantity of holes and the N-type semiconductor has a large quantity of free electrons. That is to say, for the N-type semiconductor, the majority carrier is electron and the minority carrier is hole; but for the P-type semiconductor, the majority carrier is hole and the minority carrier is electron. Due to the concentration difference, comparatively speaking, electrons of an N area will be diffused to a P area, and holes of the P area will be diffused to the N area. But an "inner electric field" pointing from N to P will be formed in the case of diffusion. The function of the inner electric field is to prevent the diffusion of the majority carrier and accelerate the drift of the minority carrier. Thus, upon diffusion and drift motions reaching a balance, a special thin layer is formed. That is to say, upon the PN junction being illuminated, the holes of the N-type semiconductor in the PN junction move towards the P area and the electrons in the P area move towards the N area. Thus, current from the N area to the P area is formed and potential difference is formed in the PN junction, and hence a power source is formed.

In the embodiment of the present invention, as illustrated in FIG. 2, the P-type semiconductor 21 and the N-type semiconductor 22 are arranged in the same layer, in which the P-type semiconductor 21 is disposed on one side close to light. Of course, the N-type semiconductor 22 may also be disposed on one side close to light. No matter which case, the action principle of the silicon solar cell is not affected. Detailed description is given in the embodiment of the present invention only by taking the example illustrated in the accompanying drawing as an example.

Optionally, an intrinsic layer is disposed between the P-type semiconductor and the N-type semiconductor, and hence a PIN solar cell can be formed. The solar cell has better sensitivity in light sensation and radiation detection.

Optionally, both the P-type semiconductor and the N-type semiconductor adopt heavy doping. It should be noted that: as both the P-type semiconductor and the N-type semiconductor adopt heavy doping, large current can be generated. Of course, in view of the power supply object of the silicon solar cell, the P-type semiconductor and the N-type semiconductor may adopt light doping, etc.

Optionally, as illustrated in FIGS. 2 and 4, the display device further includes gate lines 31 and data lines 32. The P-type semiconductor or the N-type semiconductor of the silicon solar cell makes direct contact with the gate line 31 and/or the data line 32 to form electrical connection to provide an electrical signal for the gate line 31 and/or the data line 32.

As illustrated in FIG. 4, description is given in the embodiment of the present invention by taking the case that the P-type semiconductor of the silicon solar cell makes direct contact with the gate line 31 to form electrical connection to provide an electrical signal for the gate line 31 as an example. It should be noted that the electrical connection between the P-type semiconductor and the gate line and/or the data line by direct contact may be as follows: the P-type semiconductor makes direct contact with the gate line and/or the data line via a through hole and a metal wire to provide the electrical signal for the gate line and/or the data line. Of course, the electric energy of the silicon solar cell may also be connected with other conductive components to provide electrical signal for other conductive components. The P-type semiconductor or the N-type semiconductor may also be electrically connected with other conductive components via leads, etc.

Optionally, the display region includes a plurality of sub-pixels. Each sub-pixel includes a light transmission area and a light shield area. A silicon solar cell is disposed in the light transmission area of at least one sub-pixel. The case that the silicon solar cell is disposed in the light transmission area of the sub-pixel may be as follows: the silicon solar cell is only disposed in a light transmission area of a red sub-pixel, or the silicon solar cells are disposed in light transmission areas of the red sub-pixel and a blue sub-pixel and the silicon solar cell is not disposed in a light transmission area of a green sub-pixel. That is to say, light transmission areas of partial sub-pixels may be provided with silicon solar cells, so that electric energy can be produced through the silicon solar cells; but other sub-pixels are not provided with silicon solar cells; and hence the transparent display function of the display device can be guaranteed.

The light transmission area of each sub-pixel is provided with a silicon solar cell. As illustrated in FIG. 2, light transmission areas of the red sub-pixel (R), the blue sub-pixel (B) and the green sub-pixel (G) are all provided with silicon solar cells. Thus, the electric energy conversion of the silicon solar cells on the panel can be further increased.

Optionally, the display device is an OLED display device. Each sub-pixel includes a light-emitting area and a light transmission area. As illustrated in FIG. 2, a red sub-pixel 10 includes a light-emitting area 11 and a light transmission area 12. It should be noted that: as the OLED display device is a self-luminescent display device, the sub-pixel 10 includes a light-emitting area 11 and a light transmission area 12 and the light-emitting area 11 is a light shield area. When the display device is a liquid crystal display (LCD) device, the sub-pixel may include a pixel area and a light transmission area; in the pixel area, liquid crystals are driven to deflect through a pixel electrode and a common electrode to achieve display, so the pixel area is a light shield area; and light is transmitted from the light transmission area of the display device, and hence the transparent display effect can be achieved.

Optionally, a silicon solar cell is disposed in partial area of one side of the light transmission area close to the light-emitting area. As illustrated in FIG. 2, a silicon solar cell is disposed in an area of one side of the light transmission area 12 close to the light-emitting area 11. Therefore, the case that the silicon solar cell occupies too much area of the light-emitting area can be avoided, and hence the transparency of the transparent display device can be improved.

The embodiment of the present invention further provides a method for manufacturing a transparent display device. A display region of the transparent display device includes light transmission areas and light shield areas. The method comprises:

directly forming silicon solar cells in corresponding areas on a base substrate, corresponding to partial areas of light transmission areas, the silicon solar cell being configured to absorb optical energy in the direction perpendicular to the light transmission direction of the light transmission area and converting the optical energy into electric energy.

Optionally, as illustrated in FIG. 5, the step of directly forming the silicon solar cells on the base substrate corresponding to the partial areas of the light transmission areas includes:

Step 101: forming a semiconductor layer on the base substrate, the semiconductor layer including portions corresponding to P-type semiconductors and portions corresponding to N-type semiconductors.

The step of forming the semiconductor layer on the base substrate may be as follows: forming a semiconductor film on the base substrate and forming semiconductor patterns, including the portions corresponding to the P-type semiconductors and the portions corresponding to the N-type semiconductors, by patterning process.

Step 102: performing ion doping on the portions corresponding to the P-type semiconductors and the portions corresponding to the N-type semiconductors of the semiconductor layer respectively to form the P-type semiconductors and the N-type semiconductors.

Optionally, the step of performing ion doping on the portions corresponding to the P-type semiconductors and the portions corresponding to the N-type semiconductors of the semiconductor layer respectively includes:

performing ion doping on the portion of the semiconductor layer corresponding to the P-type semiconductor via a first mask to form the P-type semiconductor; and performing ion doping on the portion of the semiconductor layer corresponding to the N-type semiconductor via a second mask to form the N-type semiconductor.

The step of performing ion doping on the portion of the semiconductor layer corresponding to the P-type semiconductor via the first mask to form the P-type semiconductor includes: only exposing the portion of the semiconductor layer corresponding to the P-type semiconductor via the first mask, shielding other portions, and performing ion doping on the exposed portion corresponding to the P-type semiconductor to form the P-type semiconductor. The step of performing ion doping on the portion of the semiconductor layer corresponding to the N-type semiconductor via the second mask to form the N-type semiconductor includes: only exposing the portion of the semiconductor layer corresponding to the N-type semiconductor via the second mask, shielding other portions, and performing ion doping on the exposed portion corresponding to the N-type semiconductor to form the N-type semiconductor.

Optionally, the semiconductor layer further includes: active semiconductors. As thin-film transistors (TFTs) are also formed on the base substrate to control pixel charge, the semiconductor layer further includes the active semiconductors. The active semiconductor may be formed as follows: forming a semiconductor film on the base substrate, and forming the portion corresponding to the P-type semiconductor, the portion corresponding to the N-type semiconductor and a pattern of the active semiconductor by patterning process. Thus, the manufacturing process can be further reduced and the manufacturing cost can be reduced.

Optionally, the method further comprises:

forming a gate metal layer and a source/drain metal layer on the base substrate, wherein the gate metal layer includes gate lines, and the source/drain metal layer includes data lines; and allowing the gate lines and/or the data lines to make direct contact with the P-type semiconductors or the N-type semiconductors of the silicon solar cells to form electrical connection.

It should be noted that: apart from films or layer structures provided by the embodiment of the present invention, the base substrate is also provided with other films or layer structures to achieve display function. The base substrate is provided with a gate metal layer including gate lines and gate electrodes and a source/drain metal layer including data lines and source/drain electrodes. The gate lines are configured to provide gate signals for the gate electrodes. The data lines are configured to provide source signals for the source electrodes. Drain electrodes are configured to charge pixel electrodes. The gate electrode, the source electrode and the drain electrode are three poles of a TFT.

In the embodiment of the present invention, the step of allowing the gate lines and/or the data lines to make direct contact with the P-type semiconductors or the N-type semiconductors of the silicon solar cells to form electrical connection may allow the electric energy converted by the silicon solar cells to be directly applied in drive TFTs. The electric energy converted by the silicon solar cells may be also applied in other conductive components by voltage processing, etc.

In the transparent display device and the manufacturing method thereof, provided by the embodiment of the present invention, at least one silicon solar cell is disposed in partial area of the light transmission area of the transparent display device, and the silicon solar cell is configured to absorb optical energy in the direction perpendicular to the light transmission direction of the light transmission area and convert the optical energy into the electric energy which may be used for supplying power for display devices or other components or devices. Therefore, the energy sources can be saved, and hence the effective utilization of light and electricity can be achieved.

The above embodiments are only intended to illustrate the present invention and not intended to limit the present invention. Various changes and deformations may also be made by those skilled in the art without departing from the spirit and scope of the present invention. Therefore, all the changes and deformations and equivalent technical proposals shall also fall within the scope of the present invention. The scope of protection of the patent of the present invention shall be defined by the appended claims.

The application claims priority to the Chinese patent application No. 201410153794.5, filed Apr. 16, 2014, titled "Transparent Display Device and Manufacturing Method Thereof", which is incorporated herein by reference in its entirety.

The invention claimed is:

1. A transparent display device, comprising a display region including a light transmission area and a light shield area, wherein at least one silicon solar cell is disposed in a partial area of the light transmission area; and the silicon solar cell is configured to absorb optical energy in a direction perpendicular to a light transmission direction of the light transmission area and convert the optical energy into electric energy.

2. The display device according to claim 1, wherein the silicon solar cell includes a P-type semiconductor and an N-type semiconductor which are arranged in a same layer.

3. The display device according to claim 2, wherein an intrinsic layer is disposed between the P-type semiconductor and the N-type semiconductor.

4. The display device according to claim 2, wherein both the P-type semiconductor and the N-type semiconductor are heavily doped.

5. The display device according to claim 2, further comprising a gate line and a data line, wherein the P-type semiconductor or the N-type semiconductor of the silicon solar cell makes direct contact with the gate line and/or the data line to form electrical connection to provide an electrical signal for the gate line and/or the data line.

6. The display device according to claim 1, wherein the display region includes a plurality of sub-pixels; each sub-pixel includes the light transmission area and the light shield area; and the silicon solar cell is provided in the light transmission area of at least one sub-pixel.

7. The display device according to claim 6, wherein the light transmission area of each sub-pixel is provided with one silicon solar cell.

8. The display device according to claim 7, wherein the display device is an organic light-emitting diode (OLED) display device; and each sub-pixel includes a light-emitting area and the light transmission area.

9. The display device according to claim 8, wherein the silicon solar cell is disposed in the partial area on a side of the light transmission area close to the light-emitting area.

10. The display device according to claim 2, wherein the display region includes a plurality of sub-pixels; each sub-pixel includes the light transmission area and the light shield area; and the silicon solar cell is provided in the light transmission area of at least one sub-pixel.

11. The display device according to claim 3, wherein both the P-type semiconductor and the N-type semiconductor are heavily doped.

12. The display device according to claim 3, further comprising a gate line and a data line, wherein
the P-type semiconductor or the N-type semiconductor of the silicon solar cell makes direct contact with the gate line and/or the data line to form electrical connection to provide an electrical signal for the gate line and/or the data line.

13. The display device according to claim 3, wherein the display region includes a plurality of sub-pixels; each sub-pixel includes the light transmission area and the light shield area; and the silicon solar cell is provided in the light transmission area of at least one sub-pixel.

14. The display device according to claim 4, wherein the display region includes a plurality of sub-pixels; each sub-pixel includes the light transmission area and the light shield area; and the silicon solar cell is provided in the light transmission area of at least one sub-pixel.

15. The display device according to claim 5, wherein the display region includes a plurality of sub-pixels; each sub-pixel includes the light transmission area and the light shield area; and the silicon solar cell is provided in the light transmission area of at least one sub-pixel.

16. A method for manufacturing a transparent display device, the transparent display device comprising a display region including a light transmission area and a light shield area, the method comprising:
directly forming a silicon solar cell in an area on a base substrate, corresponding to a partial area of the light transmission area, wherein the silicon solar cell is configured to absorb optical energy in a direction perpendicular to a light transmission direction of the light transmission area and convert the optical energy into electric energy.

17. The manufacturing method according to claim 16, wherein
a semiconductor layer is formed on the base substrate and includes a portion corresponding to a P-type semiconductor and a portion corresponding to an N-type semiconductor; and
the portion corresponding to the P-type semiconductor and the portion corresponding to the N-type semiconductor of the semiconductor layer are subjected to ion doping respectively to form the P-type semiconductor and the N-type semiconductor.

18. The manufacturing method according to claim 17, wherein
the portion of the semiconductor layer corresponding to the P-type semiconductor is subjected to ion doping via a first mask to form the P-type semiconductor; and
the portion of the semiconductor layer corresponding to the N-type semiconductor is subjected to ion doping via a second mask to form the N-type semiconductor.

19. The manufacturing method according to claim 17, wherein the semiconductor layer further includes: an active semiconductor.

20. The manufacturing method according to claim 16, further comprising:
forming a gate metal layer and a source/drain metal layer on the base substrate, wherein the gate metal layer includes a gate line, and the source/drain metal layer include a data line; and
allowing the gate line and/or the data line to make direct contact with the P-type semiconductor or the N-type semiconductor of the silicon solar cell to form electrical connection.

* * * * *